(12) United States Patent
Hur et al.

(10) Patent No.: US 9,979,352 B2
(45) Date of Patent: May 22, 2018

(54) SYSTEMS AND METHODS FOR LINEARIZING OPERATION OF A POWER AMPLIFIER

(71) Applicant: QUALCOMM Incorporated, San Diego, CA (US)

(72) Inventors: Joonhoi Hur, San Diego, CA (US); Paul Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/188,602

(22) Filed: Jun. 21, 2016

(65) Prior Publication Data

US 2017/0257068 A1 Sep. 7, 2017

Related U.S. Application Data

(60) Provisional application No. 62/340,356, filed on May 23, 2016, provisional application No. 62/302,387, filed on Mar. 2, 2016.

(51) Int. Cl.
| | |
|---|---|
| H03F 1/02 | (2006.01) |
| H03F 1/30 | (2006.01) |
| H03F 1/32 | (2006.01) |
| H03F 3/193 | (2006.01) |
| H03F 3/21 | (2006.01) |

(52) U.S. Cl.
CPC ......... *H03F 1/0233* (2013.01); *H03F 1/0288* (2013.01); *H03F 1/301* (2013.01); *H03F 1/3247* (2013.01); *H03F 3/193* (2013.01); *H03F 3/21* (2013.01); *H03F 2200/105* (2013.01); *H03F 2200/18* (2013.01); *H03F 2200/451* (2013.01); *H03F 2201/3233* (2013.01)

(58) Field of Classification Search
USPC .................. 330/295, 124 R, 84, 286, 53–54, 330/296–297, 289
See application file for complete search history.

(56) References Cited

U.S. PATENT DOCUMENTS

| | | | |
|---|---|---|---|
| 6,917,246 | B2 | 7/2005 | Thompson |
| 8,344,824 | B2 | 1/2013 | Kim et al. |
| 8,483,631 | B2 | 7/2013 | Coan et al. |
| (Continued) | | | |

FOREIGN PATENT DOCUMENTS

| | | |
|---|---|---|
| JP | H10232723 A | 9/1998 |
| JP | 2008205592 A | 9/2008 |

OTHER PUBLICATIONS

Colantonio P., et al., "The Doherty Power Amplifier"; Advanced Microwave Circuits and Systems; Apr. 2010; pp. 108-132; InTech; Rijeka, Croatia.

(Continued)

*Primary Examiner* — Hieu Nguyen
(74) *Attorney, Agent, or Firm* — Haynes and Boone, LLP

(57) ABSTRACT

A circuit including a power amplifier having a control terminal configured to control an output level of the power amplifier, a bias circuit in communication with the control terminal, the bias circuit including a tunable plurality of diodes in series configured to supply a bias voltage to the control terminal, and a control circuit in communication with the bias circuit configured to tune the plurality of diodes in series to create the bias voltage in response to a supply voltage of the amplifier.

23 Claims, 8 Drawing Sheets

(56) References Cited

U.S. PATENT DOCUMENTS

| | | | |
|---|---|---|---|
| 8,604,881 | B2 | 12/2013 | Sankalp et al. |
| 8,737,526 | B2 | 5/2014 | Coan et al. |
| 8,964,821 | B2 | 2/2015 | Coan et al. |
| 9,172,331 | B2 * | 10/2015 | Nagasaku ............... H03F 3/24 |
| 9,231,527 | B2 | 1/2016 | Hur et al. |
| 9,252,713 | B2 | 2/2016 | Hur et al. |
| 2006/0017509 | A1 | 1/2006 | Veitschegger |
| 2010/0271123 | A1 | 10/2010 | Forrester et al. |
| 2011/0175681 | A1 | 7/2011 | Inamori et al. |
| 2012/0299659 | A1 | 11/2012 | Sankalp et al. |
| 2014/0152390 | A1 | 6/2014 | McMorrow et al. |
| 2015/0295541 | A1 | 10/2015 | Hur et al. |
| 2016/0126921 | A1 * | 5/2016 | Hur ........................ H03F 3/24 |
| | | | 343/852 |

OTHER PUBLICATIONS

Rubio J.M., et al., "3-3.6-GHz Wideband GaN Doherty Power Amplifier Exploiting Output Compensation Stages", IEEE Transactions on Microwave Theory and Techniques, Aug. 2012, vol. 60, No. 8, pp. 2543-2548.

International Search Report and Written Opinion—PCT/US2016/017261—ISA/EPO—Apr. 7, 2017.

Lee J-W, et al., "+17 dBm High-Efficiency CMOS Power Amplifiers Operating at High Voltage for 24 GHz Radar Sensor", IET Circuits, Devices and SYS, vol. 4, No. 2, Mar. 25, 2010 (Mar. 25, 2010), XP006035007, pp. 131-137.

Seo I, et al., "Comparison of Quasi-/Pseudo-Floating Gate Techniques", Proceedings I 2004 IEEE International Symposium on Circuits and Systems: May 23-26, 2004, Sheraton Vancouver Wall Centre Hotel, Vancouver, British Columbia, Canada, IEEE Operations Center, Piscataway, NJ, May 23, 2004 (May 23, 2004), XP010719635, pp. 365-368.

* cited by examiner

Pth$_A$: Turn on the linearizer (envelope)
Pth$_B$: Weaken the voltage boosting (envelope)

|  | Vdd_1 | Vdd_2 | Vdd_3 |
|---|---|---|---|
| Pth$_A$ | 11dBm (1stack) | 17dBm (2stack) | 23dBm (3stack) |
| Pth$_B$ | 16dBm (2stack) | 22dBm (3stack) | 28dBm (4stack) |
| P$_{SAT}$ | 21dBm | 27dBm | 33dBm |

SYSTEMS AND METHODS FOR LINEARIZING OPERATION OF A POWER AMPLIFIER

CROSS-REFERENCE TO RELATED APPLICATIONS

The present application claims the benefit of U.S. Provisional Patent Application No. 62/302,387, filed Mar. 2, 2016, and entitled "Systems and Methods for Linearizing Operation of a Power Amplifier," and claims the benefit of U.S. Provisional Patent Application No. 62/340,356, filed May 23, 2016, and entitled "Systems and Methods for Linearizing Operation of a Power Amplifier," the disclosure of which are incorporated by reference herein in their entirety.

TECHNICAL FIELD

This application relates to power amplifiers, and more particularly, to linearizing operation of power amplifiers.

BACKGROUND

Wireless systems typically include a transmitter and receiver coupled to an antenna to send and receive Radio Frequency (RF) signals. Generally, a baseband system generates a digital signal that includes encoded information (data), and the digital signal is converted to an analog signal for transmission. The analog signal is processed and typically modulated (up converted) to an RF carrier frequency. After up conversion, the RF signal is coupled to an antenna through a power amplifier. The power amplifier increases the signal power so that the RF signal can communicate with a remote system, such as a base station, for example.

Wireless systems generally use power amplifiers that can transmit RF signals with a considerable range of instantaneous and average signal power levels. Generally, power amplifiers are sized and designed such that the optimal efficiency is only at the maximum instantaneous output power, resulting in a significant reduction in efficiency for dynamic signals. As such, advanced architectures that provide higher efficiency at output power levels other than the maximum instantaneous output power are sought.

One example amplifier architecture that finds use in RF systems is a Doherty amplifier. A Doherty amplifier includes a main power amplifier stage, usually a class A or AB power amplifier, and a peak power amplifier stage, usually a class C power amplifier. It would be desirable to increase efficiency of the Doherty amplifier in order to maintain performance by using less power, especially over a variety of power supply levels.

SUMMARY

According to one embodiment, a circuit includes a power amplifier having a control terminal configured to control an output level of the power amplifier, a bias circuit in communication with the control terminal, the bias circuit including a tunable plurality of diodes in series configured to supply a bias voltage to the control terminal, and a control circuit in communication with the bias circuit configured to tune the plurality of diodes in series to create the bias voltage in response to a supply voltage of the amplifier.

According to another embodiment, a method includes receiving an adjustable power supply voltage at a power amplifier, in response to a level of the power supply voltage, tuning a plurality of series diodes that is coupled to a control terminal of a transistor of the power amplifier to create a bias voltage at the control terminal, and amplifying a Radio Frequency (RF) signal applied to the control terminal of the power amplifier.

According to another embodiment, a circuit includes a power amplifier having a control terminal configured to control an output voltage level of the power amplifier, a power supply in communication with the power amplifier, the power supply configured to modulate a supply voltage of the power amplifier in response to the output voltage level, a bias circuit in communication with the control terminal, the bias circuit including a tunable group of non-linear voltage drop components configured to supply a bias voltage to the control terminal, and a control circuit in communication with the bias circuit configured to tune the group of non-linear voltage drop components to create the bias voltage in response to the supply voltage of the amplifier.

According to another embodiment, an amplifier includes a transistor having a control terminal configured to control an output voltage level of the amplifier, means for modulating a supply voltage of the transistor in response to the output voltage level of the amplifier, means for supplying a bias voltage to the control terminal of the transistor, the bias voltage supplying means including selectable non-linear voltage drop components; and means to control the bias voltage in response to the supply voltage by selecting ones of the non-linear voltage drop components.

DESCRIPTION

Circuits and methods for linearizing operation of a power amplifier are provided. In one example, a power amplifier receives a variable supply voltage, which may be adjusted according to an average output power level, a power envelope, or other metric. The power amplifier also has a gate bias circuit. The gate bias circuit includes a tunable voltage divider. A control circuit tunes the voltage divider to create a bias voltage at the gate in response to a selected supply voltage of the amplifier. In one example, the tunable voltage divider includes a plurality of switchable diodes in series, where the plurality of diodes in series may also be referred to as a diode stack.

Continuing with the example, the power amplifier may include any of a variety of types of power amplifiers, including a class B power amplifier, a class AB power amplifier, a class C power amplifier, or a power amplifier included in a Doherty arrangement.

Some examples further include a Process, Voltage, and Temperature variation (PVT) compensation circuit configured to raise or lower a voltage applied to the voltage divider in response to an increase or decrease in threshold voltage of a PVT compensation transistor. Further examples include methods for using the circuits described above. For example, a method for amplifying an input voltage signal includes adjusting a supply voltage of a power amplifier in response to a power level of an output signal of the amplifier and tuning a voltage divider in response to the supply voltage to bias a gate of a transistor of the amplifier.

Various embodiments provide one or more advantages over conventional solutions. For instance, in some embodiments linearizing the operation of the power amplifier may further increase the efficiency of the power amplifier. In scenarios in which the power amplifier is deployed in a handheld device or other battery-operated device, such efficiency may result in valuable power savings. These and other advantages may be better appreciated by the detailed description below.

Figure 1:
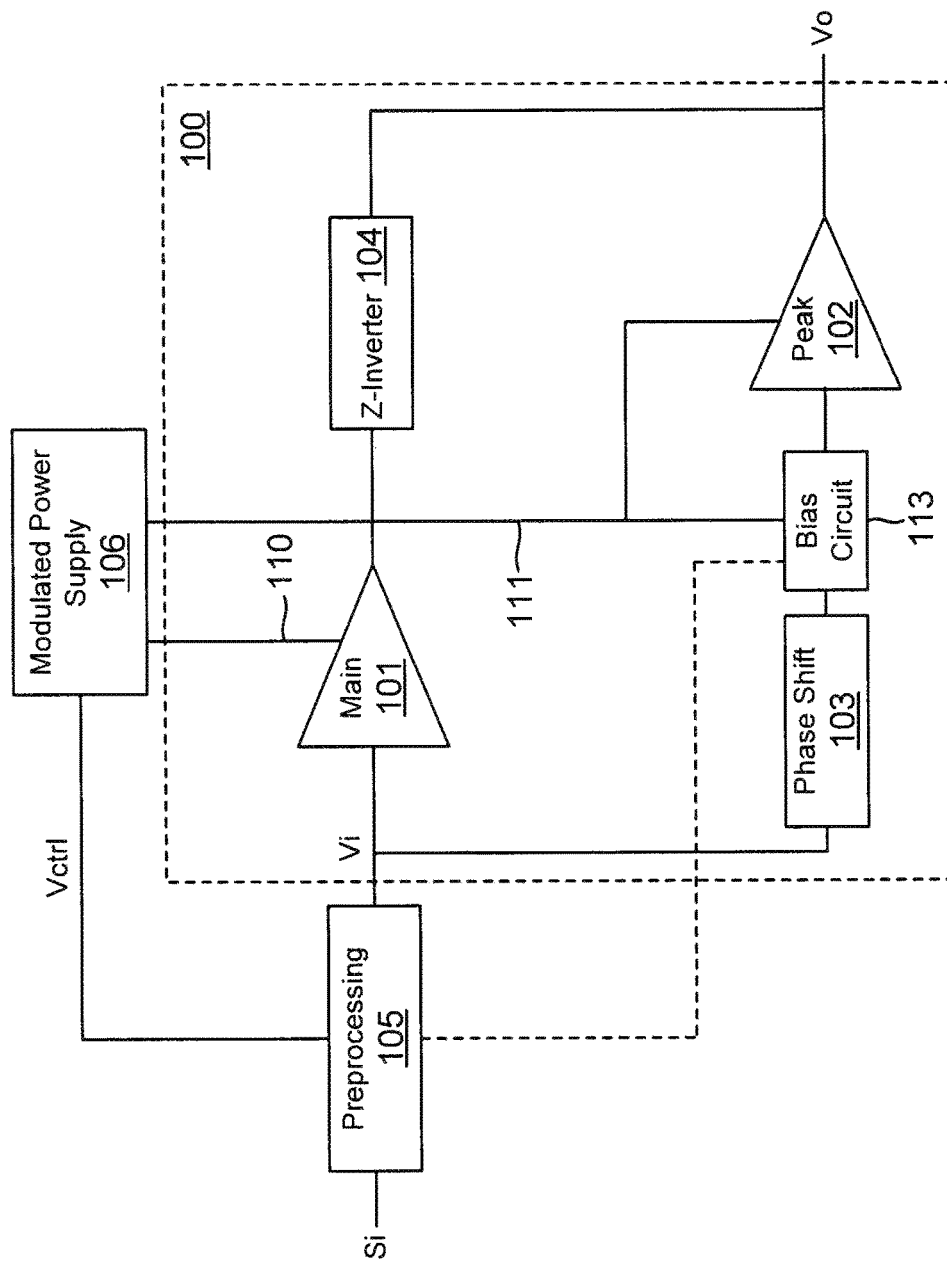
FIG. 1 illustrates an example amplifier architecture in accordance with an embodiment of the disclosure.

FIG. 1 illustrates an example Doherty power amplifier, according to one embodiment. Embodiments of the present disclosure include a power amplifier 100 comprising a main (or carrier) amplifier stage 101 and a peaking (or auxiliary) amplifier stage 102. An output of the peaking amplifier stage 102 is coupled to an output of the main amplifier stage 101 through an impedance inverter circuit 104, which may be implemented as a quarter-wave transmission line, for example. The output of the peaking amplifier stage 102 is coupled to an output terminal of power amplifier 100. An RF input signal, Vi, is received at an input of the main amplifier stage 101. Power amplifier 100 may be a radio frequency (RF) power amplifier configured to drive an antenna (not shown). The RF input signal Vi is also coupled to the input of peaking amplifier stage 102 through a quarter wave phase shift circuit 103, for example. Power amplifier 100 produces an output voltage, Vo, on the output terminal, which may be coupled to an antenna.

Doherty amplifiers demonstrate high efficiency over a wide output power range. In some embodiments, the main amplifier stage may be class A, AB, or B, and the peaking amplifier stage may be class C, F, or another switch mode power amplifier, for example. Switch mode power amplifiers are normally off when receiving a small input signal below some threshold, and only produce an output when a sufficiently high input drive level is received. The peaking amplifier stage may be off for small signal amplitudes and may turn on for larger signal amplitudes. For example, the main amplifier may include a biased class A or class AB and the peaking amplifier may be biased at class C so that the peaking amplifier turns on when the input power is above a threshold (e.g., just before the main amplifier starts to go into compression). As explained further below, a bias circuit 113 biases the peaking amplifier stage to improve efficiency of the amplifier.

Main amplifier stage 101 and peaking amplifier stage 102 include power supply terminals 110 and 11, respectively, that are coupled to a modulated power supply circuit 106. The power supply voltages provided to the power supply terminals 111 and 112 of the main and peaking amplifiers may change over time to improve the efficiency of the power amplifier. Accordingly, such varying power supply voltages are referred to as dynamic power supply voltages, and may change between different discrete voltage levels or vary continuously.

The Doherty amplifier of FIG. 1 includes modulated power supply 106. An example of purposes and features of modulated power supply 106 may be found at U.S. patent application Ser. No. 14/088,321 (the entire disclosure of which is incorporated by reference herein). In short, the purpose of the modulated power supply 106 is to change the power supply voltage based on a desired level of Vo to maintain efficiency of the Doherty amplifier within a high-efficiency plateau. In this example, the modulated power supply 106 includes a plurality of VDD levels that it can apply in response to the signal Vctrl, which includes information indicating a level for Vo. The general rule is that a greater level of power at the output of the amplifier should corresponds to a greater level of supply voltage. Other examples of dynamic power supply circuits used in power amplifiers are described in U.S. patent application Ser. No. 14/088,321, the contents of which are hereby incorporated herein by reference.

Power supply 106 may change the power supply voltage to either or both of the main and peaking amplifiers based on one or more control signals, Vctrl, for example. As illustrated in FIG. 1, an input signal Si may be received in a preprocessing block 105, such as a predistortion block, and the control signal Vctrl may change the power supply voltage(s) provided to either or both of the main and peaking amplifiers based on the characteristics of the signal to be transmitted (e.g., Vo) to improve the efficiency of the amplifier.

Embodiments of the present disclosure improve biasing of the peaking amplifier stage 102 driven by a dynamic power supply. For example peaking amplifier 102 is biased by bias circuit 113. In this example, power supply terminal 111 is coupled to an input of bias circuit 113. An output of bias circuit 113 is coupled to an input of peaking amplifier 102.

Bias circuit 113 changes a bias voltage as the power supply voltage to the peaking amplifier changes. For example, a power supply voltage on power supply terminal 111 of peaking amplifier 102 may vary across a range over time. The range may have a highest voltage value and a lowest voltage value, for example. Example embodiments of bias circuit 113 may receive the power supply voltage on terminal 111 and produce a bias voltage that is lower when the power supply voltage is high and higher when the power supply voltage is low. In other words, bias circuit 113 produces a bias voltage to the peaking amplifier that increases as a voltage on the power supply terminal 111 decreases. In some example embodiments, the bias voltage may be changed to maintain the bias point of the peaking amplifier so that appropriate peaking occurs as the power supply voltage and maximum output power changes over time. While the configuration shown in FIG. 1 illustrates an embodiment where bias circuit 113 is coupled directly to the power supply voltage, other embodiments may control the bias circuit 113 using signals produced by other circuit blocks. In one embodiment, upstream circuits, such as preprocessing circuit 105 may produce a control signal (shown using a dashed line) to the bias circuit 113 to modulate a bias voltage on the peaking amplifier 102 as described herein.

Figure 2:
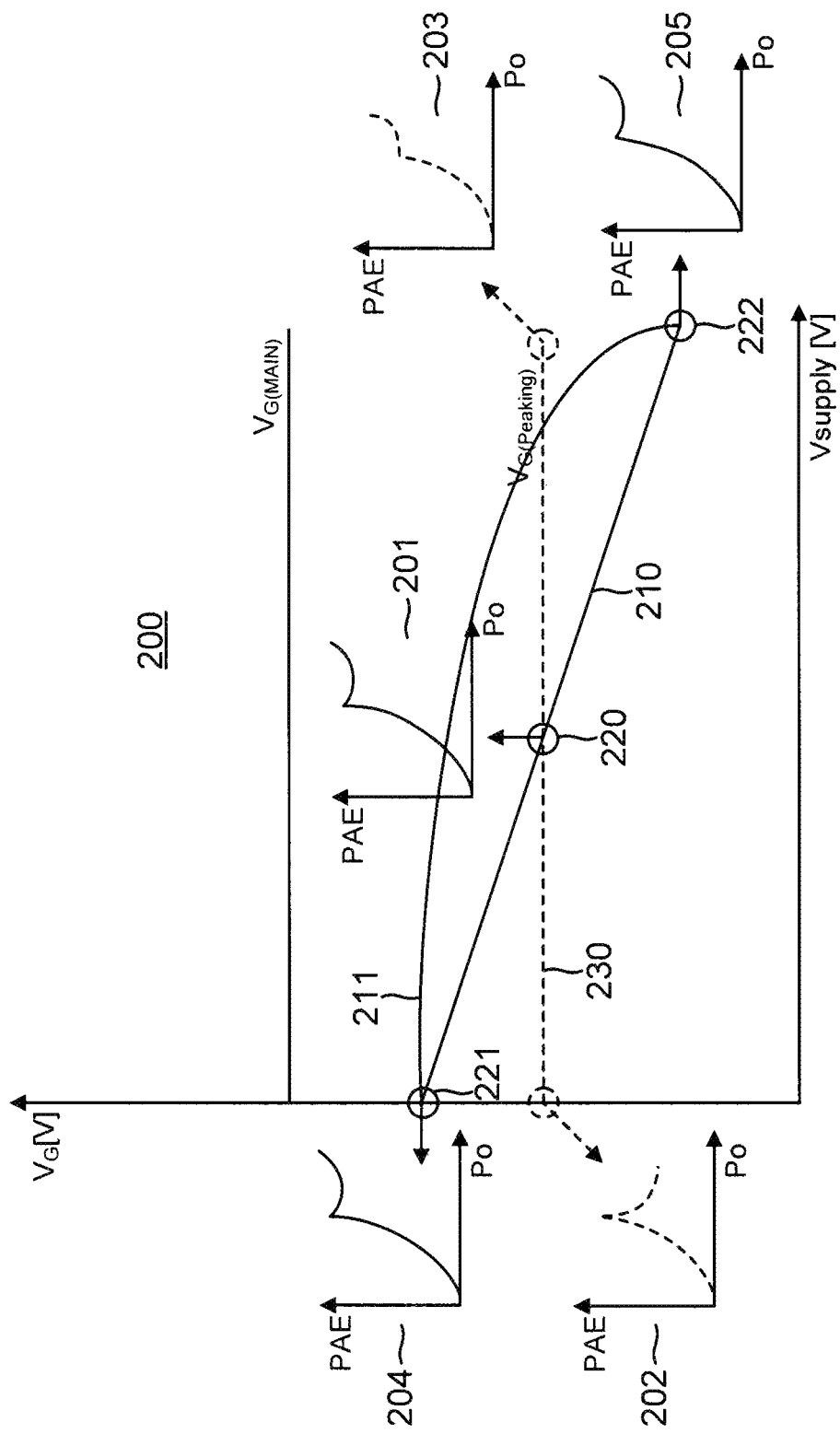
FIG. 2 illustrates an example graphs showing the effect of changing a bias voltage as a supply voltage changes in accordance with one embodiment of the disclosure.

FIG. 2 is a plot 200 of a bias voltage to a peaking amplifier that varies with the supply voltage. Plot 201 in FIG. 2 illustrates power amplifier efficiency (PAE) versus instantaneous output signal power (Po) for a Doherty amplifier at a particular power supply voltage Vsupply and bias voltage Vg corresponding to point 220. A peak efficiency of 0 dB for a Doherty amplifier typically occurs at a maximum output signal power, Po. As the normalized instantaneous output signal power is reduced at a particular supply and bias voltage, the efficiency (e.g., PAE) of the amplifier changes. As illustrated in plot 201, there is a first PAE peak at a maximum output power and a second PAE peak at a second output power below the maximum (e.g., in this example, about −6 dB below the maximum). The region between the efficiency peaks forms a plateau, where the efficiency of the power amplifier is very high for output powers across this range. In this example, PAE is approximately flat from a first PAE peak at a maximum output power down to a second PAE peak at about −6 dB from the maximum output power. Below the maximum output power by more than −6 dB, the efficiency decreases as the output power decreases.

However, if the supply voltage varies, the peaks may shift and the characteristic PAE curve may change based on the bias of the peaking amplifier. In particular, in a Doherty amplifier it is desirable to have the peaking amplifier stage turn on about 6 dB below maximum output power for the particular supply voltage. Some applications may vary the 6 dB window under different operating conditions, so references herein to the 6 dB window are to be understood as merely examples of more general Doherty peaks separated by XdB, where X is an arbitrary number of dB.

Without proper biasing, the peaking amplifier in a Doherty may turn on late with respect to the 6 dB point (i.e., at too high a power level) at low supply voltages. For instance, if the supply voltage drops, the conduction angle for a class C amplifier may be too small, which may cause it to turn on at −5 dB or −4 dB (e.g., too late relative to a −6 dB peak) from the maximum output power. Similarly, the peaking amplifier may turn on early (i.e., at too low a power level) at high supply voltage levels. For instance, if the supply voltage increases, the conduction angle for a class C amplifier may become too large, which may cause it to turn on at −7 dB, −8 dB, or −9 dB (e.g., too early relative to a −6 dB peak) from the maximum output power. Plot 200 in FIG. 2 illustrates Doherty PAE curves for a peaking amplifier with constant bias voltage across a range of supply values. If the bias is held constant, as illustrated at line 230, the maximum output power PAE peak in the Doherty PAE curve drops as the supply voltage is reduced as shown in plot 202. Similarly, the −6 dB PAE peak in the Doherty PAE curve drops as the supply voltage is increased as shown in plot 203.

As mentioned above, embodiments of the present disclosure include bias circuit 113 to change the bias of the peaking amplifier based on the supply voltage to the peaking amplifier. FIG. 2 illustrates an example where the bias voltage Vg is increased linearly (at line 210) as the supply voltage decreases. As shown in plots 204 and 205, the characteristic Doherty PAE curve can be maintained by increasing the bias voltage at lower supply voltages (plot 204 corresponding to bias and supply voltages at 221) and by reducing the bias voltage at higher supply voltages (plot 205 corresponding to bias and supply voltages at 222). As further illustrated in plot 200 in FIG. 2, other embodiments may change the bias voltage based on supply voltage according to a different (non-linear) function. FIG. 2 illustrates another curve 211 that forms another example relationship between supply voltage and peaking amplifier bias voltage. Example curve 211 illustrates that the bias voltage to the peaking amplifier monotonically increases as the supply voltage decreases. A variety of different bias voltage/power supply voltage curves may be used to maintain high efficiency in a Doherty amplifier based on the particular structure and design of the peaking amplifier.

Figure 3A:
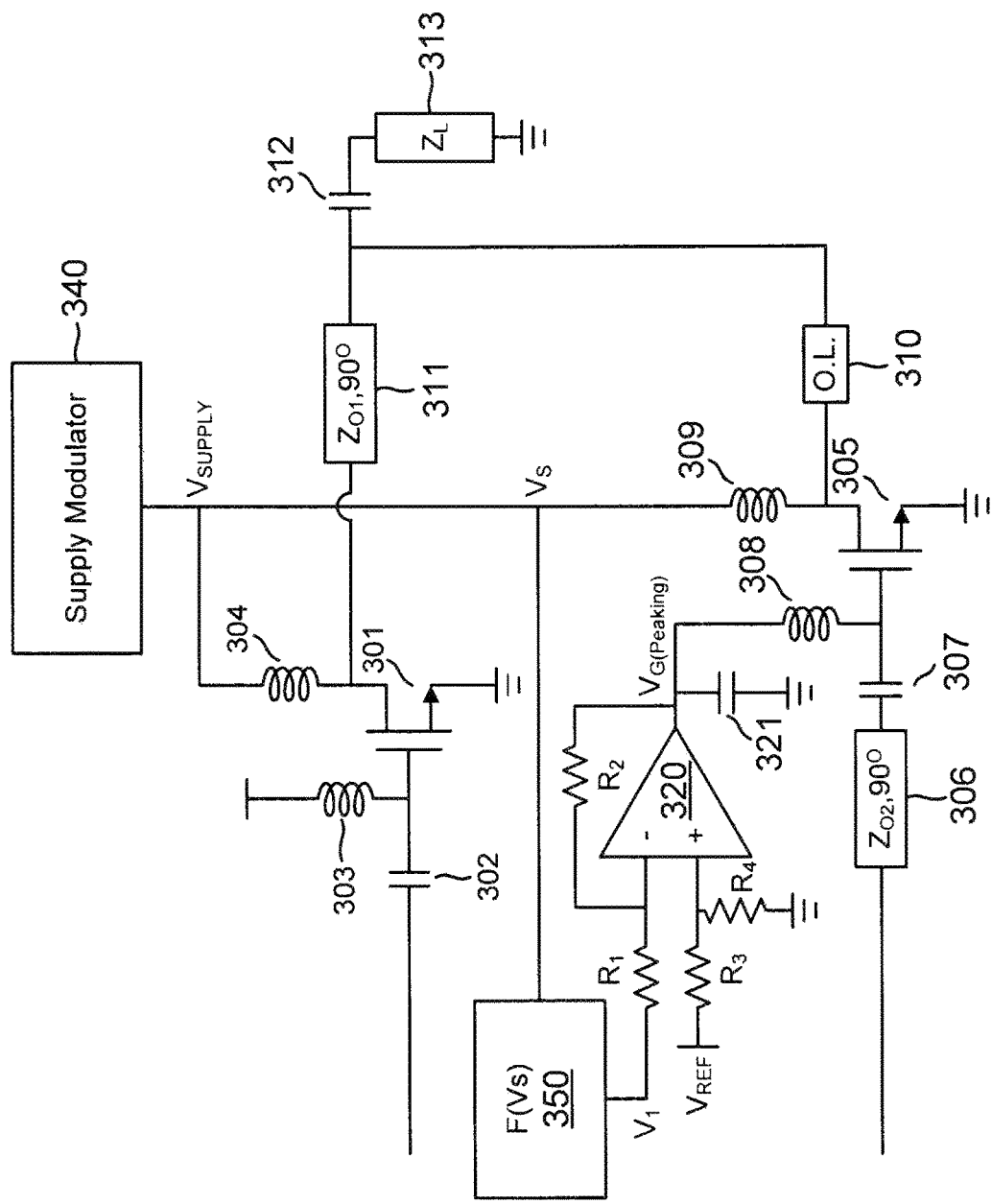
FIG. 3A illustrates an example amplifier architecture in accordance with an embodiment of the disclosure.

FIG. 3A illustrates another example power amplifier 300 and bias circuit according to another embodiment. Power amplifier 300 includes a supply modulator 340 for generating a modulated power supply voltage, Vsupply. Power amplifier 300 further includes a main amplifier stage including transistor 301 having a control terminal coupled to receive an input signal through capacitor 302. The control terminal is biased by a reference voltage through inductor 303, for example. A source of transistor 301 is coupled to ground and a drain is coupled to Vsupply through choke inductor 304.

Power amplifier 300 further includes a peaking amplifier stage including transistor 305 having a control terminal coupled to receive an input signal through quarter wave shift circuit 306 and capacitor 307. The control terminal is biased by a bias circuit through inductor 308, for example. A source of transistor 305 is coupled to ground and a drain is coupled to Vsupply through choke inductor 309. An output of the peaking stage at the drain of transistor 305 is coupled to the output of the main stage at the drain of transistor 301 through output load (OL) 310 and impedance inverter circuit 311. The output of the peaking stage is also coupled to a load 313 (e.g., an antenna and possibly other circuitry) through capacitor 312, for example.

In the present example, transistors 301 and 305 are MOS devices, but it is to be understood that other devices such as GaAs (gallium arsenide), bipolar, or other device types may be used.

In one embodiment, a bias circuit comprises a subtractor circuit. In this example implementation, the subtractor circuit includes an amplifier 320 having a negative input terminal coupled to Vsupply through resistor R1 and functional circuit 350 ("F(Vs)"). An output of amplifier 320 is coupled to the negative input through a feedback resistor R2. A positive input terminal is coupled to a reference voltage Vref through resistor R3 and to ground through resistor R4. In some embodiments, Vref may be modulated as well (e.g., according to the same modulation as Vsupply). The amplifier produces bias voltage Vg (peaking) on capacitor 321 and to one terminal of inductor 308. At low frequencies, inductor 308 is a short circuit, and Vg (peaking) is coupled to the gate of transistor 305 to set the bias on the peaking stage.

Functional circuit 350 may be used to control the relationship between bias voltage Vg (peaking) and Vsupply. In one example, circuit 350 may be a short circuit so that the bias voltage is approximately linearly related to Vsupply. In other embodiments, functional circuit 350 may produce other functional relations between Vsupply and V1, which is provided to the subtractor circuit. For example, functional circuit may cause V1 to be Vsupply squared (e.g., "V1= (Vsupply)$^2$"). As another example, functional circuit 350 may cause V1 to be a polynomial of Vsupply (e.g., "V1=Vsupply+A(Vsupply)$^2$," where A is a constant).

For the linear example, bias circuit subtracts a value proportional to Vsupply from another value proportional to Vref. Thus, when Vsupply is large, the output voltage is low, and as Vsupply decreases, the amount subtracted from Vref decreases and the bias voltage increases. The bias circuit in FIG. 3 is one example implementation that may be used to produce a linearly changing bias voltage as shown in FIG. 2. Based on the present disclosure, it is to be understood that a variety of other subtraction circuits could be used to vary the bias voltage on a peaking amplifier to improve efficiency of the power amplifier.

Figure 3B:
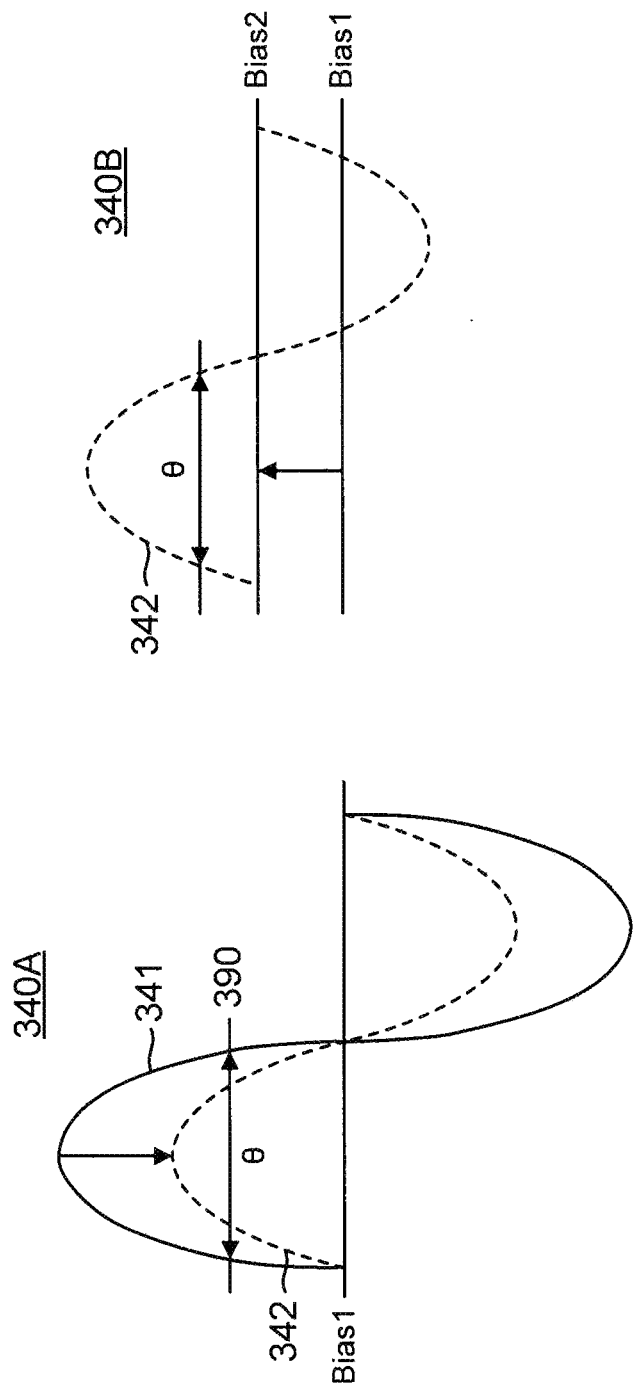
FIG. 3B illustrates an example graph of input signals to the peaking amplifier for different supply voltages according to one embodiment of the disclosure.

FIG. 3B illustrates input signals to the peaking amplifier for different supply voltages. Transistor 305 may be biased just below conduction (e.g., off) so that only input signals with a voltage above a particular threshold may produce an output. Plot 340A illustrates an input voltage signal 341 to a peaking amplifier at a first supply voltage for maximum output power and an input voltage signal 342 to the peaking amplifier for a lower output power at a lower supply voltage. At maximum power, the peaking amplifier is biased at a first bias level, BIAS1, so that the peaking amplifier produces an output based on the input signal when the input voltage is above a first level illustrated at 390. For a sinusoidal signal, the peaking amplifier may be biased to output only a portion of the input signal, denoted by a phase angle "θ" (e.g., a phase of the input generating an output). However, as the output power is backed off from a maximum, the system may reduce the power supply voltage and the input voltage signal to the peaking amplifier.

For the same bias voltage, BIAS1, a reduced input voltage signal 342 will result in a smaller portion of the input signal being coupled to the output (e.g., the phase angle "θ" is reduced) and the power amplifier will operate less efficiently. Accordingly, as the output power is reduced, corresponding reductions in the power supply voltage and input voltage can be compensated for by increasing the bias voltage from BIAS1 to BIAS2, for example, as shown at 340B. Here, input signal 342 is DC shifted up with a larger bias voltage at lower power supply voltages to maintain an approximately constant portion of the signal amplified at the output (e.g., the phase angle θ is maintained across variations in supply voltage).

Returning to the example of FIG. 1, bias circuit 113 may include the subtractor circuit of FIG. 3. Additionally or alternatively, bias circuit 113 may further include the bias adjustment circuit 410 of FIG. 4A. FIG. 4B provides an example table and graph to show timing of operation of bias adjustment circuit 410 according to one embodiment.

Bias adjustment circuit 410 adjusts a bias voltage of a control terminal (e.g., gate) of a transistor at peak amplifier 102. Bias adjustment circuit 410 affects a point at which the transistor at peak amplifier 102 turns on in order to keep efficiency high across a range of supply voltages.

Various embodiments of the description include bias adjustment circuit 410 as an adjustable diode stack at the gate of the transistor of the peak amplifier 102 to further provide adjustment for the bias voltage. An additional feature includes a PVT compensation circuit 420 configured to further adjust the bias voltage to compensate for Power, Voltage, and Temperature (PVT) variation.

As noted above with respect to FIG. 1, the modulated power supply 106 provides a variety of VDD levels, each of the VDD levels corresponding to a range of output power (or Vo level) in order to maintain efficiency in a high range. The table of FIG. 4B shows three VDD levels, VDD_1, VDD_2, and VDD_3. The modulated power supply 106 chooses among these three VDD levels in this example depending on desired output power. Of course, various embodiments may include any number of VDD levels as appropriate.

Figure 4A:
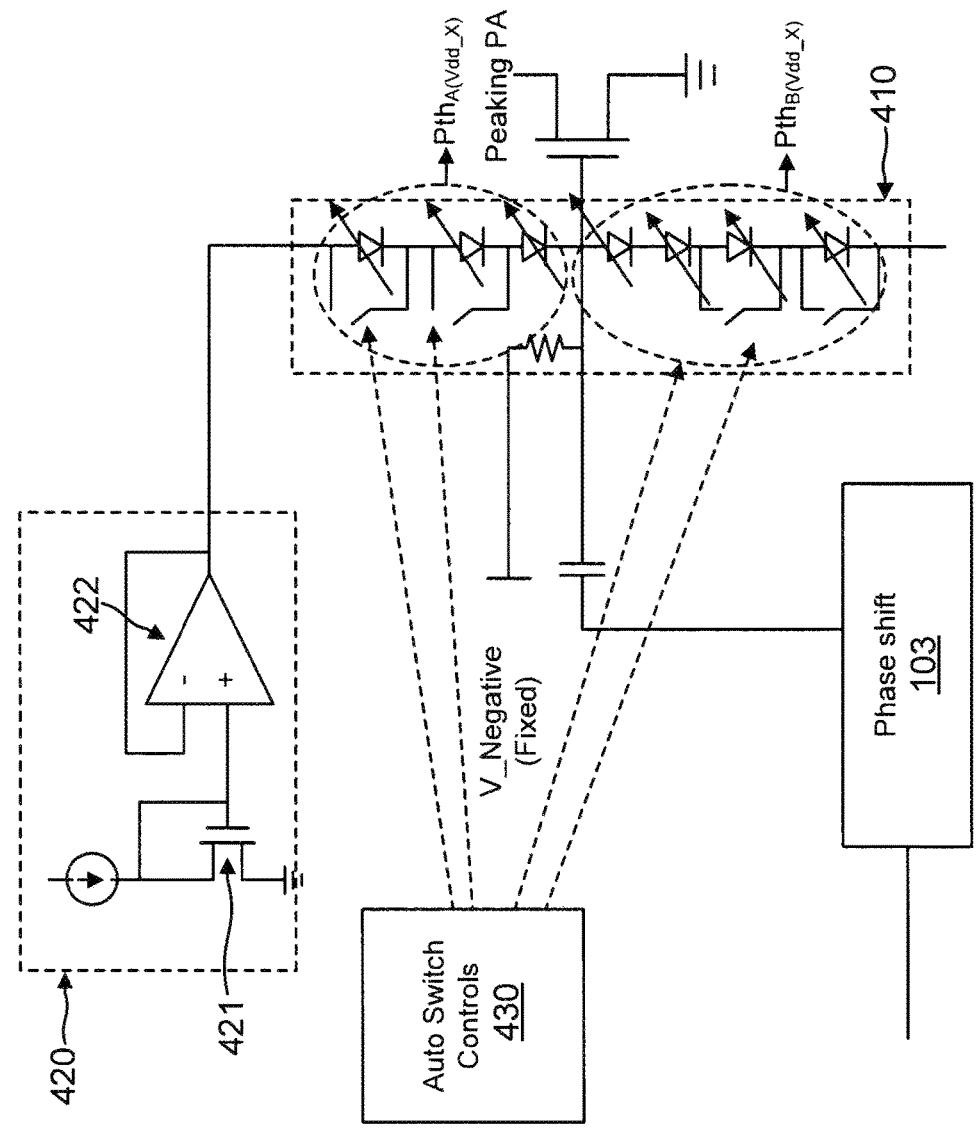
FIG. 4A illustrates an example gate biasing circuit to be used with a power amplifier in accordance with an embodiment of the disclosure.
Figure 4B:
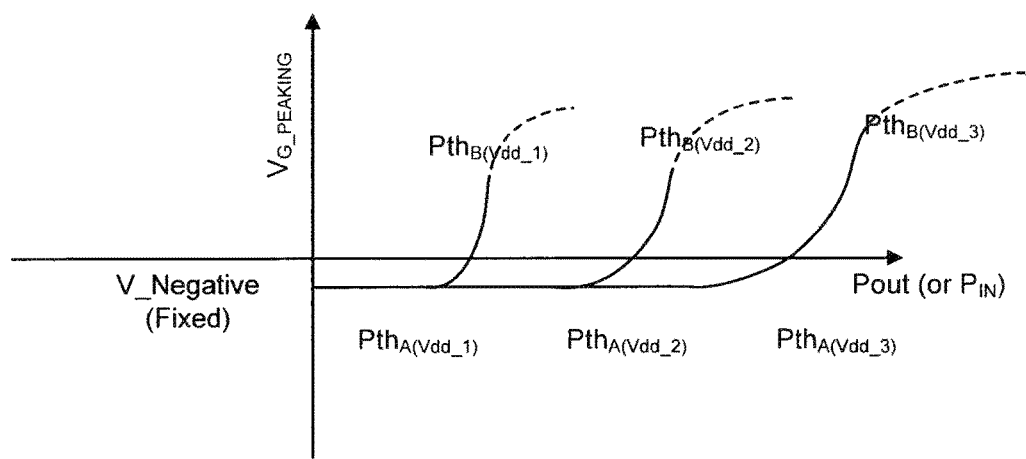
FIG. 4B illustrates an example table and graphs showing timing for selecting ones of the diodes in the circuit of FIG. 4A.

FIG. 4A further shows a portion of a circuit for simplicity, including a PVT compensation circuit 420, a stack of switchable diodes in bias adjustment circuit 410, and a transistor "Peaking PA" with a control terminal (in this case, a gate) coupled to the stack of switchable diodes. The terminal labeled "V_Negative (Fixed)" indicates a terminal at which the subtractor circuit of FIG. 3 may be coupled within the architecture of FIG. 4A. In other words, V_Negative may be increased as a supply voltage decreases and decreased as a supply voltage increases to provide more efficient operation of the power amplifier, as described with respect to FIG. 3. However, some embodiments may omit the subtractor circuit of FIG. 3 and instead hold that terminal at a fixed voltage.

The stack of switchable diodes in bias adjustment circuit 410 provides a tunable voltage drop to bias the gate of the transistor, and the transistor represents the gate of a transistor at the peak amplifier 102. The topmost switchable diodes in the stack are denoted as $P_{THA}$, and the bottommost diodes in the stack are denoted as $P_{THB}$.

When modulated power supply 106 applies a VDD level, the auto switch control circuit 430 is aware of the change and applies control signals to the switches at the selectable diodes to either bypass some diodes or include some diodes within the voltage divider. Auto switch control circuit 430 selects the number diodes in the stack in this example based on a look up table, provided in the table of FIG. 4B. For instance, if the modulated power supply 106 begins to apply VDD_2, the auto switch control circuit goes to the lookup table to the appropriate column under VDD_2, where the entry at $P_{THA}$ includes data indicating that two diodes should be in the topmost portion of the voltage divider (i.e., one of the three diodes should be bypassed by closing a switch).

As the voltage rises at the gate of the transistor, the auto switch control circuit then consults the look up table under the column VDD_2, where the entry at $P_{THB}$ includes data indicating that three diodes should be in the bottommost portion of the voltage divider (i.e., one of the four diodes should be bypassed by closing a switch). A graph at the top rightmost portion of FIG. 4B plots the gate voltage ($V_{G\_peaking}$) against Pout and shows voltage rising profiles that are applied with each VDD_X. These voltage rising profiles provide a quick rise in the voltage of the gate so transistor turns on quickly to provide appropriate gain for a given VDD. $P_{THB}$ setting weaken the voltage boosting to avoid saturation. The transistor is also turned off in the same manner. The $P_{SAT}$ values in the table provide an indication of when saturation may occur and when the corresponding $P_{THB}$ setting should be applied relative to applying the $P_{THA}$ setting.

Figure 5:
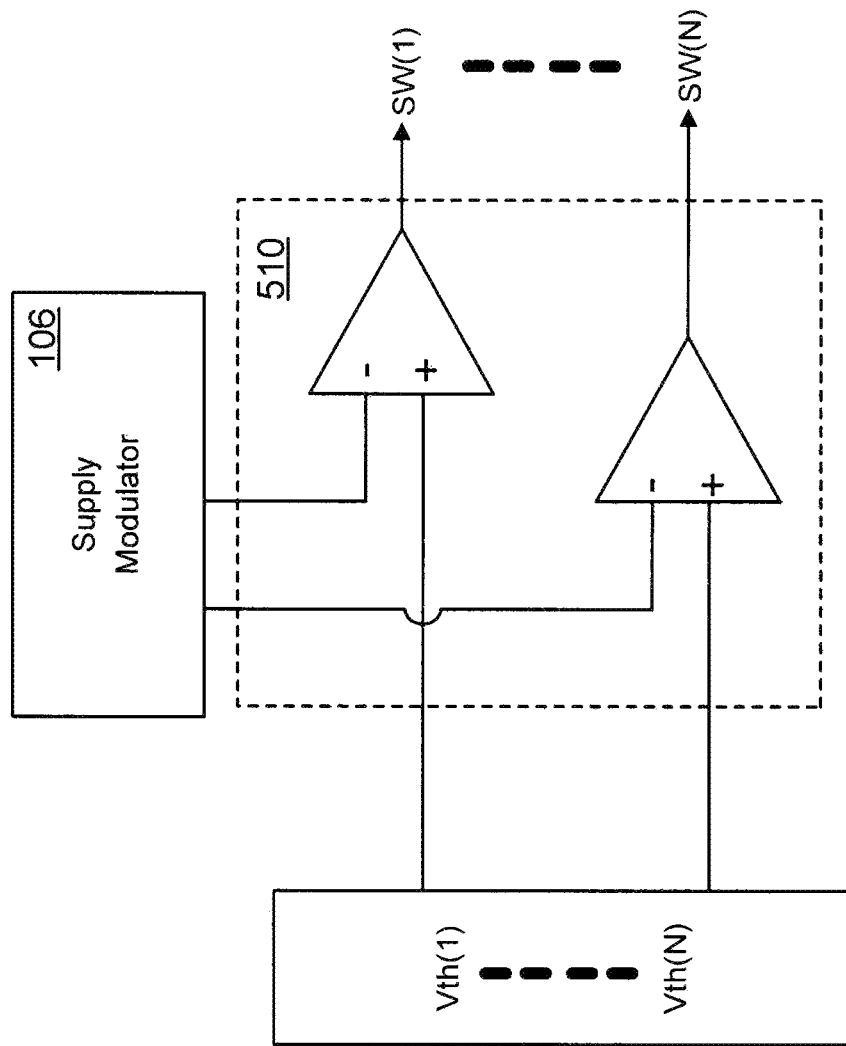
FIG. 5 provides an example embodiment for the auto switch control of FIG. 4A according to one embodiment of the disclosure.

The example above describes the auto switch control circuit 430 as a digital control circuit that consults a look up table. However the scope of embodiments may further include an analog auto switch control circuit 430, as shown in FIG. 5. FIG. 5 provides an example embodiment for the auto switch control circuit 430 of FIG. 4A. The example of FIG. 5 uses comparators 510 coupled with the supply modulator 106, wherein each of the comparators receives a respective reference voltage Vth that is programmed so as to provide switching control signals (SW) to the bypass switches of the diode stack in accordance with a given supply voltage level. Various embodiments may include any appropriate technique or circuit to provide switching controls.

Returning to FIG. 4A, the number of diodes in the diode stack may be different in different embodiments. Generally, more diodes in the diode stack provide for a greater degree of tunability of the circuit. Further in this example, the PVT compensation circuit 420 also adjusts the bias in a way that compensates for PVT variation. In this example, both the transistor 421 in the PVT compensation circuit 420 and the transistor in the peak amplifier are the same type of transistor and are assumed to be affected in the same or similar manner by PVT variation. Specifically, in this example both transistors are NMOS transistors. The transistor 421 in the PVT compensation circuit is diode-connected, and it causes a voltage drop that changes based on PVT variation. This provides an incremental change in voltage at the output of the feedback amplifier 422 and further to the switchable diode stack. In short, PVT variation reducing the threshold voltage of the PVT compensation transistor 421 incrementally lowers the voltage at the output of the feedback amplifier 422, thereby compensating for the corresponding lower threshold voltage at the peak amplifier transistor. The sizes of the PVT compensation transistor 421 and the peak amplifier transistor may be chosen as appropriate to provide predictable compensation.

The circuit of FIG. 4A can be used in the Doherty amplifier of FIG. 1 to bias the peak amplifier 102 by providing the output of phase shift circuit 103 to the gate of the transistor, where the transistor of FIG. 4A is included in peak amplifier 102. Similarly, the circuit of FIG. 4A may be added to the circuit of FIG. 3 by being coupled with the gate of transistor 305. However, the scope of embodiments is not limited to Doherty amplifiers. Rather, the diode stack, auto switch controls 430, and the PVT compensation circuit 420 of FIG. 4A can be applied to bias a control terminal of an amplifier of any appropriate type, including a class B power amplifier, a class AB power amplifier, a class C power amplifier, and the like, whether a power amplifier is implemented alone or in a larger amplifier architecture.

In the present example, the transistor of FIG. 4A is a metal oxide semiconductor (MOS) device, but it is understood that other devices such as bipolar junction transistors may be used in various embodiments.

The diodes in the diode stack of bias adjustment circuit 410 may be implemented in any appropriate manner, including using diode-connected transistors for the diodes. The bypass switches also may be implemented in any appropriate manner, including by use of transistors. The diodes are chosen to have nonlinear behavior to match the voltage curves shown in the graph of FIG. 4B, where such voltage curves complement the non-linear behavior of the peak amplifier transistor. The diodes of the diode stack are similar to a resistive voltage divider, but with the non-linear behavior provided by the transistors. However, the scope of embodiments is not limited to the use of a diode stack, as other embodiments may use a resistive voltage divider, such as a resistor ladder, to provide a bias voltage at the gate of the amplifier.

Circuit 410 of FIG. 4A is described herein as being tunable, and the voltage drop provided by circuit 410 is also described as being tunable. In the examples herein, tuning may include but is not limited to using switching elements to bypass and/or insert circuit elements into a circuit path, such as by including or bypassing diodes. Tuning many also include but is not limited to adjusting the bias of circuit elements in order to adjust their parameters, such as by adjusting a voltage applied to the diodes. Further, these tuning techniques along with those now known or later developed may be used individually, or in any combination of these techniques to adjust the bias voltage at a control terminal of an amplifier.

Figure 6:
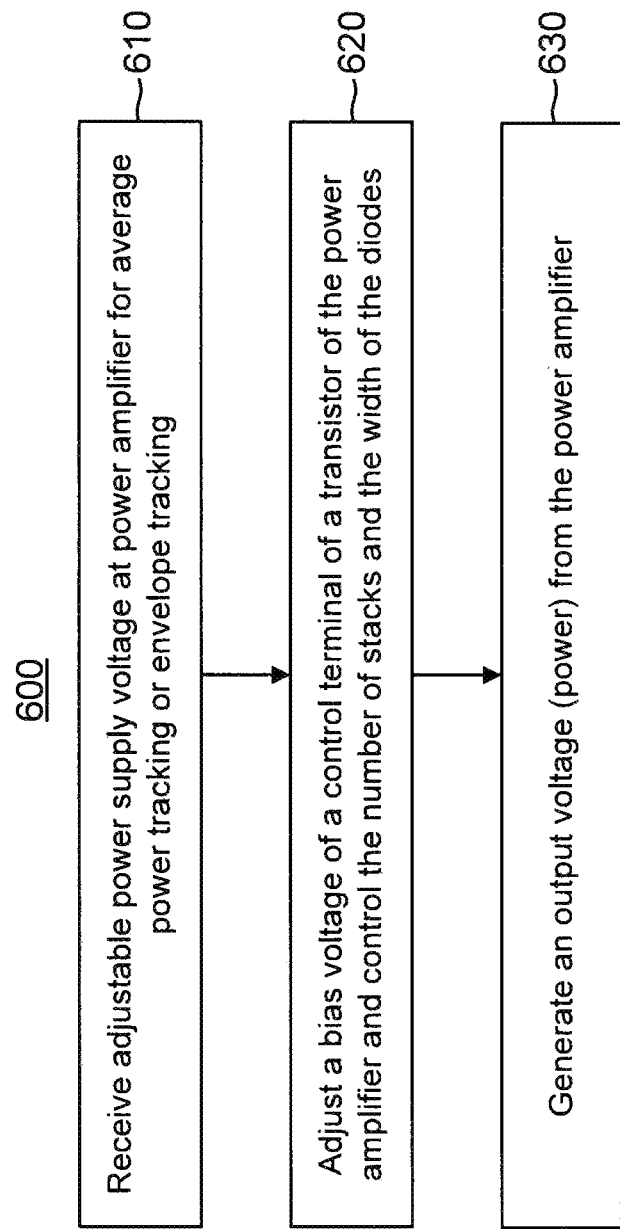
FIG. 6 is an illustration of an example method to be performed with the circuits of FIGS. 1 and 4 according to an embodiment of the disclosure.

FIG. 6 is an illustration of an example method in which the circuit of FIG. 4A may be used. At action 610, the power amplifier receives an adjustable power supply voltage. An example is explained above with respect to FIG. 1, where modulated power supply 106 adjusts the power supply level over time to improve the efficiency of the power amplifier. For example, the power supply may change the power supply voltage based on a desired level of Vo to maintain efficiency of the power amplifier. One example includes adjusting the power supply of the Doherty amplifier to maintain the Doherty amplifier within a high-efficiency plateau according to a power envelope of the amplifier output, as described in the U.S. patent application Ser. No. 14/088,321. In such an instance, action 610 may further include receiving an envelope signal from a modem or other component, where the envelope signal is a control signal to the power amplifier and corresponding to a level of Vo.

Another example includes an average power tracking scenario, where the adjustments change between different discrete voltage levels in response to an average power at the output of the amplifier. Average power tracking generally works at a lower rate than does the power envelope tracking mentioned above. Average power tracking is generally more efficient, although envelope tracking may provide various efficiency gains when the input signal waveforms have a peak average power ratio approaching 12 dB.

In an example including a Doherty amplifier, the adjustable power supply voltage may be applied to both a main amplifier and a peaking amplifier. However, various embodiments include providing the adjustable power supply voltage to a single power amplifier or more than two power amplifiers, as appropriate.

At action 620, the circuit adjusts a bias voltage of a control terminal of the transistor of the power amplifier. An example is illustrated with respect to FIG. 4A, wherein the automatic switch control circuit 430 opens and closes bypass switches for diodes in the bias adjustment circuit 410 in response to a VDD level. The result is that the circuit of FIG. 4A may provide different gate bias voltages for different power output levels at the power amplifier. Action 620 may include receiving input indicating a VDD level, e.g., from a preprocessing circuit, such as circuit 105 of FIG. 1 or a modem, where the input is received by the auto switch control circuit 430. In response, the auto switch control circuit 430 consults a look up table or uses other logic to determine an appropriate number of diodes to bypass. The auto switch control circuit 430 opens and closes the bypass switches as appropriate to achieve a gate bias voltage.

In the example of FIGS. 4A and B, action 620 includes switching the bypass switches associated with the topmost switchable diodes (PA) to provide a bias voltage appropriate to turn on the amplifier, and then switching the bypass switches associated with the bottommost diodes in the stack ($P_{THB}$) to weaken the voltage boosting before the amplifier become saturated. Action 620 may also include adjusting a voltage of the diode stack using a PVT compensation circuit, such as the PVT compensation circuit of FIG. 4A.

Some embodiments may further include a circuit having a selectable number of diode stacks, and action 620 may include selecting an appropriate number of diode stacks. Additionally or alternatively, the particular diodes in the diode stacks may have different widths, thereby giving them different voltage drops and nonlinear properties. In such embodiments, selecting particular diodes using the bypass switches includes not only selecting a number of diodes but also selecting diodes with particular widths to provide desired performance. In some embodiments, action 620 further includes using a subtractor circuit (such as in FIG. 3) to further provide bias control, though other embodiments may omit the subtractor circuit.

At action 630, the power amplifier generates an output voltage. In some examples using a Radio Frequency (RF) power amplifier, an output terminal of the power amplifier may be coupled to an antenna to drive RF signals.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
 a power amplifier having a control terminal configured to control an output level of the power amplifier;
 a bias circuit in communication with the control terminal, the bias circuit including a tunable plurality of diodes in series configured to supply a bias voltage to the control terminal; and
 a control circuit in communication with the bias circuit configured to tune the plurality of diodes in series to create the bias voltage in response to a supply voltage of the power amplifier, wherein the control circuit comprises a plurality of comparators coupled with a power supply modulator of the power amplifier, wherein each of the comparators receives a respective reference voltage that is programmed so as to provide switching control signals to bypass switches of the plurality of diodes in series in accordance with a given supply voltage level.

2. The circuit of claim 1, wherein the power amplifier comprises a class C power amplifier.

3. The circuit of claim 1, wherein the power amplifier comprises a class AB power amplifier.

4. The circuit of claim 1, wherein the power amplifier comprises a peaking amplifier of a Doherty power amplifier.

5. The circuit of claim 1, wherein each of the diodes is associated with a bypass switch in communication with the control circuit.

6. The circuit of claim 1, further comprising:
 a Process, Voltage, Temperature (PVT) compensation circuit including a transistor having a source or drain in communication with the bias circuit, the PVT compensation circuit configured to raise or lower a voltage applied to the bias circuit in response to an increase or decrease in a threshold voltage of the transistor.

7. The circuit of claim 1, wherein the control terminal comprises a gate of a metal oxide semiconductor (MOS) transistor.

8. The circuit of claim 1, wherein the control circuit comprises a digital controller configured to receive an indication of the supply voltage and configured to determine a setting for the plurality of diodes in series in response to the supply voltage.

9. The circuit of claim 1, further comprising a modulated power supply in communication with the power amplifier, the modulated power supply configured to set the supply voltage in response to an output voltage level.

10. A circuit comprising:
 a power amplifier having a control terminal configured to control an output voltage level of the power amplifier;
 a power supply in communication with the power amplifier, the power supply configured to modulate a supply voltage of the power amplifier in response to the output voltage level;
 a bias circuit in communication with the control terminal, the bias circuit including a tunable group of non-linear voltage drop components configured to supply a bias voltage to the control terminal; and
 a control circuit in communication with the bias circuit configured to tune the tunable group of non-linear voltage drop components to create the bias voltage in response to the supply voltage of the power amplifier, wherein the control circuit comprises a plurality of comparators coupled with a power supply modulator of the power amplifier, wherein each of the comparators receives a respective reference voltage that is programmed so as to provide switching control signals to bypass switches of the tunable group of non-linear voltage drop components in accordance with a given supply voltage level.

11. The circuit of claim 10, wherein the tunable group of non-linear voltage drop components comprises a plurality of diodes in series, each of the diodes being associated with a bypass switch.

12. The circuit of claim 10, wherein the tunable group of non-linear voltage drop components comprises a plurality of diodes in series, various ones of the diodes in series having different widths and being independently selectable.

13. The circuit of claim 10, wherein the power amplifier comprises a class C power amplifier.

14. The circuit of claim 10, wherein the power amplifier comprises a peaking amplifier of a Doherty power amplifier.

15. The circuit of claim 10, further comprising:
 a Process, Voltage, Temperature (PVT) compensation circuit including a transistor having a source or drain in communication with the bias circuit, the PVT compensation circuit configured to raise or lower a voltage applied to the bias circuit in response to an increase or decrease in a threshold voltage of the transistor.

16. The circuit of claim 10, wherein the control circuit comprises a digital controller configured to receive an indication of the supply voltage and configured to determine a setting for the tunable group of non-linear voltage drop components in response to the supply voltage.

17. An amplifier comprising:
 a transistor having a control terminal configured to control an output voltage level of the amplifier;
 means for modulating a supply voltage of the transistor in response to the output voltage level of the amplifier;
 means for supplying a bias voltage to the control terminal of the transistor, the bias voltage supplying means including selectable non-linear voltage drop components; and
 means to control the bias voltage in response to the supply voltage by selecting ones of the non-linear voltage drop components, wherein the bias voltage controlling means comprises a plurality of comparators coupled with the supply voltage modulating means, wherein each of the comparators receives a respective reference voltage that is programmed so as to provide switching control signals to bypass switches of the selectable non-linear voltage drop components in accordance with a given supply voltage level.

18. The amplifier of claim 17, wherein the selectable non-linear voltage drop components comprise a plurality of diodes in series, each of the diodes being associated with a bypass switch.

19. The amplifier of claim 17, wherein the selectable non-linear voltage drop components comprise a plurality of diodes in series, various ones of the diodes in series having different widths.

20. The amplifier of claim 17, wherein the amplifier comprises a class C power amplifier.

21. The amplifier of claim 17, wherein the amplifier comprises a peaking amplifier of a Doherty power amplifier.

22. The amplifier of claim 17, further comprising:
a Process, Voltage, Temperature (PVT) compensation circuit including a second transistor having a source or drain in communication with the bias voltage supplying means, the PVT compensation circuit configured to raise or lower a voltage applied to the bias voltage supplying means in response to an increase or decrease in a threshold voltage of the second transistor.

23. The amplifier of claim 17, wherein the bias voltage controlling means comprises a digital controlling means to receive an indication of the supply voltage and configured to determine a setting for the selectable non-linear voltage drop components in response to the supply voltage.

* * * * *